United States Patent [19]

Wort et al.

[11] Patent Number: 4,911,809

[45] Date of Patent: Mar. 27, 1990

[54] THIN FILM DEPOSITION PROCESS

[75] Inventors: Christopher J. Wort; Lynn Y. Dorey, both of Northants, United Kingdom

[73] Assignee: Plessey Overseas Limited, Ilford, United Kingdom

[21] Appl. No.: 228,897

[22] Filed: Aug. 5, 1988

[30] Foreign Application Priority Data

Aug. 6, 1987 [GB] United Kingdom ............... 8718653

[51] Int. Cl.[4] ............................................. C23C 14/46
[52] U.S. Cl. ............................ 204/192.11; 204/192.12; 204/192.26; 204/298
[58] Field of Search ...................... 204/192.12, 192.15, 204/192.18, 192.2, 192.22, 192.24, 192.26, 192.11, 298 PD, 298 MD

[56] References Cited

U.S. PATENT DOCUMENTS 4,731,172 3/1988 Adachi et al. .................. 204/192.26
4,793,908 12/1988 Scott et al. ..................... 204/192.26

FOREIGN PATENT DOCUMENTS 2180262 3/1987 United Kingdom ............. 204/192.1

OTHER PUBLICATIONS

E. Kay et al., *IBM Tech. Disc. Bull.*, vol. 12, No. 9, Feb. 1970, p. 1358.
R. N. Castellano et al., *J. Vac. Sci. Technol.*, vol. 16, No. 2, Mar./Apr. 1979, p. 184.

Primary Examiner—Aaron Weisstuch
Attorney, Agent, or Firm—Fleit, Jacobson, Cohn, Price, Holman & Stern

[57] ABSTRACT

A thin film deposition process comprises the steps of providing a first target area on a magnetron electrode, sputtering particles from said area so that they fall onto a heated substrate body for forming the required deposit, simultaneously operating a sputtering gun such that further particles are dislodged from a second target area and directed towards the substrate, the two resulting particle plasmas mixing at the substrate surface such that a deposit of a predetermined chemical composition is produced.

This allows a multicomponent material such as a PLZT ceramic to be deposited without a change in composition due to different volatilities etc. of the components.

9 Claims, 2 Drawing Sheets

THIN FILM DEPOSITION PROCESS

This invention relates to a thin film deposition process. It relates particularly to the deposition of films of multicomponent materials such as lead lanthanum zirconate titanate.

There is an increasing interest in this film formation of multicomponent materials for specialised device applications where bulk materials or ceramics do not exhibit the necessary properties. The deposition of multicomponent materials where the volatilities of the individual components are very different has lead to much research into physical vapor (plasma) deposition techniques. The present invention was devised to aid the deposition of such materials and, in particular, the deposition of ferroelectric oxide materials such as lead lanthanum zircoante titanate (PLZT).

Thin films of ferroelectric perovskites (such as PLZT) are of interest of electro-optic device applications, where high quality thin films of materials with large electro-optic coefficients (deposited directly onto silicon integrated circuitry) would enable higher operational switching speeds in many nonlinear optical devices.

When a multicomponent material such as PLZT is used as the target material in a sputtering system numerous problems are encountered in depositing a crystalline thin film having the same stoichiometry as the target material. There are several main reasons for this, (1) the sputter rates and (2) the sticking coefficients of the individual components (for example, lead, lanthanum, zirconium and titanium atoms) are very different; (3) the volatiles are different (for example, that of lead is very high) and hence the more volatile components(s) can be lost from the deposited layer if the substrate has to be heated. In the case of PLZT, the temperature necessary for crystallisation in the perovskite phase is about 600° C. In addition, the possibility of negative ion resputtering of the most volatile component (this being lead in the example mentioned) can further cause a component deficiency.

According to the present invention, there is provided a thin film deposition process, the process comprising the steps of providing a first target area on a magnetron electrode, sputtering particles from said first target area so that they fall onto a heated substrate body for forming the required deposit, simultaneously operating a sputtering gun such that further particles are dislodged from a second target area and directed towards the substrate, the two resulting particle plasmas mixing at the substrate surface such that a deposit of predetermined chemical composition is produced.

The said first target may be of a ceramic PLZT material. The second target may be a metal body. The metal body may be formed with adjacent areas of two metals having a common dividing line.

The invention also comprises an apparatus for depositing multicomponent materials by a film deposition process.

By way of example, a particular embodiment of the invention will now be described with reference to the accompanying drawings, in which.

Figure 1:
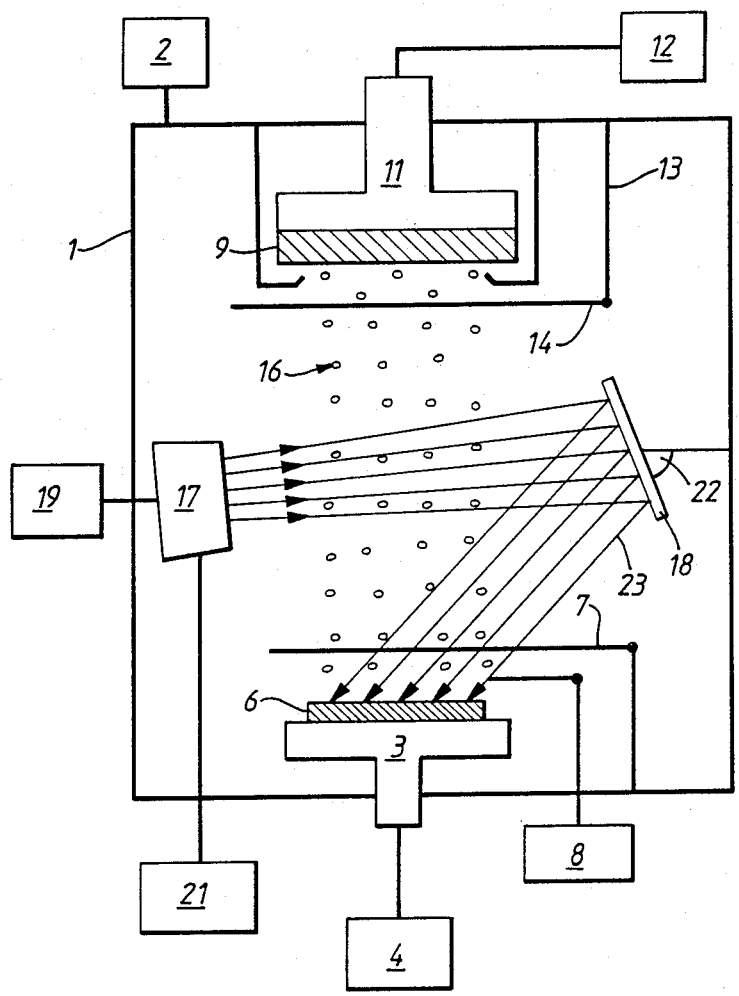
FIG. 1 is a diagram of the deposition apparatus.

As shown in FIG. 1, the apparatus comprises a vacuum deposition chamber 1 which is provided with a gas pumping system 2. The chamber 1 includes a substrate heater 3 the temperature of which is stabilised by a heater control system 4. The heater 3 is capable of supporting a substrate body 6 which is arranged to receive the required deposit layer. The substrate body 6 surface is capable of being covered over or not covered by adjustment of a movable substrate shutter 7.

The apparatus also includes an oxygen feed pipe by which an oxygen supply may be delivered to the surface of the substrate body 6 from an oxygen feed supply 8.

In an upper portion of the chamber 1, a ceramic PLZT target body 9 is mounted on a magnetron electrode 11 which is adjustable in order to allow correct spacing for the sputtering system.

The magnetron electrode 11 is provided with an electrical power supply 12 and a matching electrical network; in addition it has passages for allowing a flow of cooling water. The electrode 11 and target body 9 are surrounded by a ground shield 13. The target body 9 may also be covered over or not covered by adjustment of a movable target shutter 14.

The magnetron electrode 11 thus gives the possibility of sputtering a single target material at a high rate of deposition onto the substrate body 6. The plasma particles 16 from the target body 9 will be directed normally towards the substrate body 6.

Located between the magnetron electrode 11 and the substrate body 6, a sputtering gun which in this embodiment is a Fast Atomic Beam (FAB) gun 17 is positioned where particles from a second sputtering target 18 may be caused to fall on the substrate body 6. The FAB gun 17 is provided with a power supply 19 and there is also a gas feed source 21 capable of delivering a suitable gas such as argon or argon/oxygen to the gun 17. The second sputtering target 18 may be adjusted externally by variations of the angle 22 and also by variations of its position such that sputtered target 18 material will tend to fall on the substrate body 6. These plasma particles 23 will thus be able to mix with the plasma particles 16 from target body 9 on the surface of the body 6.

In operation of the apparatus, the substrate body 6 is placed on the substrate heater 3 in the deposition chamber 1. The separation between the substrate body 6 and the PLZT ceramic target body 9, mounted on the magnetron electrode 11, is adjusted to allow the correct geometry for the FAB sputtering system. The second sputtering target 18 which in this embodiment is made of lead is angled such that when the plasma from the FAB gun 17 irradiates the surface, the resulting sputtered lead particles will impinge on the substrate body 6 surface. Having set up the correct deposition geometry, the chamber 1 is evacuated by the gas pumping system 2 which is a liquid nitrogen cooled diffusion pump backed by a rotary pump. Argon is fed into the chamber at the required pressure through the FAB gun 17. The shutters 7 and 14 are placed across the target 9 and substrate 6, to allow pre-cleaning of the targets 9 and 18 by the plasmas from the magnetron electrode 11 and FAB gun 17, respectively. Once the targets are clean the substrate deposition temperature is set at about 600° C. on the substrate heater 3 and it is kept constant by the control system 4.

The required reactive atmosphere is established using mass flow control electronics to feed argon into the FAB gun 17 and oxygen to the substrate 6 surface in the required concentrations. The FAB gun plasma particles 23 are adjusted to the required power levels using the power supply 19 and the magnetron plasma particles 16 are tuned to the correct power level using the power supply 12. Once the plasmas are stable, the shutters 7 and 14 are removed and the deposition of PLZT commences.

The lead content of the deposited layers can be varied by altering the relative powers applied to the FAB gun 17 and the magnetron electrode 11. The magnetron electrode 11 serves to give a high rate of deposition of the plasma particles 16 on the substrate body 6. Because the material of the target body 9 can be a multicomponent material, this can result in a variation of the composition of the material actually forming the deposit for the reasons already described. A fine compositional tuning can thus be provided by sputtering the second target material from the target 18 and this can be effected as necessary by independently operating the gun 17. The material from the target body 18 is combined at a similar energy with the lead, langthanum, zirconium and titanium particles from the target body 9 where these impinge on the substrate so that the stoichiometry of the deposit can be tailored to a given application. Lead particles can thus be added as required to the deposit. A further advantage of the technique is that the lead deposit is directional so that severe contamination problems and the problems involved with handling volatile lead compounds can be avoided.

Figure 2A:
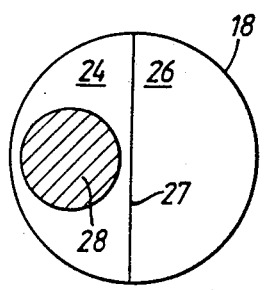
FIGS. 2A, 2B and 2C show target areas from the apparatus with a common dividing line positioned between two materials carried on the target, and, FIG. 3 is a cross-sectional view of a substrate body carrying a deposited layer of a multicomponent material which was produced in the apparatus.
Figure 2B:
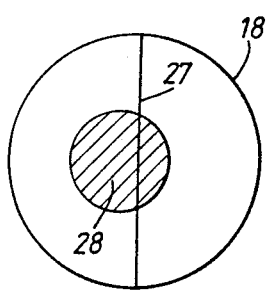
Figure 2C:
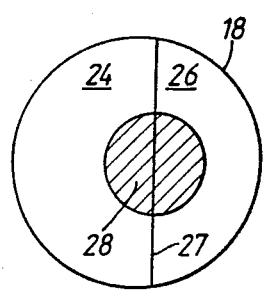

An alternative construction for the second sputtering target 18 is shown in FIGS. 2A, 2B and 2C. In this construction, the target area is formed with areas 24, 26 of two metals having a common dividing line 27. The two metals could be lead and titanium. This gives the possibility of further varying the composition of the deposited layer without changing the PLZT target on the magnetron electrode 11. This is done by varying the position of the FAB irradiated area 28. In FIG. 2A, the irradiated area 28 is shown entirely to the left of the dividing line 27. In FIG. 2B the irradiated area 28 has been moved partially over the dividing line and in FIG. 2C the irradiated area 28 is arranged equally on both sides of the dividing line. This arrangement thus allows the sputtered material at the substrate surface to contain particles from either part of the target 18 or any mixture of these particles.

In this manner, a large range of PLZT compositions could be obtained from a single ceramic target body 9 coupled to a FAB sputtered lead/titanium target 18.

Figure 3:
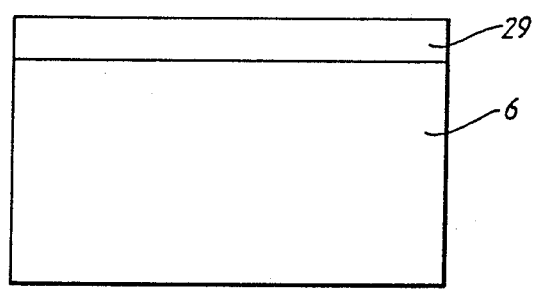

FIG. 3 is a cross-sectional view showing the product of the deposition process with the substrate body 6 supporting the deposited layer 29 of multicomponent material.

The foregoing description of an embodiment of the invention has been given by way of example only and a number of modifications may be made without departing from the scope of the invention as defined in the appended claims. For instance, it is not essential that the radiation source for the second sputtering target should be the FAB gun 17; in a different embodiment the FAB gun could be replaced by an alternative sputtering gun such as an ion gun.

In addition, the deposition appparatus shown in FIG. 1 could be rearranged to give other, equally effective sputtering geometries. The target body 9 could be of an alternative construction such as a multi-component metal target or a powder target.

The power supply 12 and matching network for the magnetron electrode could be for radio frequency or direct current operation. If required, the substrate heater 3 could be mounted externally of the vacuum chamber. The oxygen feed supply 8 to the substrate body 6 could be replaced by any suitable gas feed. The gas feed source 21 to the gun 17 instead of argon could be any inert gas.

We claim:

1. A thin film deposition process, the process comprising the steps of providing a first target area on a magnetron electrode, sputtering particles from said first target area so that they fall onto a heated substrate body for forming the required deposit, simultaneously operating a sputtering gun such that particles are dislodged from a second target area and directed towards the substrate, resulting in two particle plasmas, the two resulting particle plasmas mixing at the substrate surface such that a deposit of a predetermined chemical composition is produced.

2. A process as claimed in claim 1, in which the said first target is of a ceramic PLZT material.

3. A process as claimed in claim 1, in which the said second target is a metal body.

4. A process as claimed in claim 3, in which the said metal body is formed with areas of two metals having a common dividing line.

5. Apparatus for a thin film deposition process, the apparatus comprising a vacuum chamber, means inside the chamber for supporting a substrate body and means for heating said body, a first deposition source and a target area in the chamber, the first deposition source being capable of providing a particle stream directed at the target area to dislodge material from the target area and direct said dislodged material in the form of a plasma cloud towards said substrate body, a second deposition source which is a magnetron electrode capable of forming a second particle plasma cloud adjacent said substrate body and mutually independent control means for each of the two deposition sources, the arrangement being such that a mixture of the two plasma clouds can be formed adjacent said body and a deposit of a predetermined chemical composition laid down on said substrate body.

6. Apparatus as claimed in claim 5, in which said first deposition source is a fast atomic beam sputtering gun.

7. Apparatus as claimed in claim 5, in which said first deposition source is an ion beam gun.

8. Apparatus as claimed in claim 5, in which said target area for the first deposition source is provided with discrete surface regions of differing chemical composition, means being provided to direct the particle stream towards one or more of said regions to permit variation in the composition of the dislodged material.

9. Apparatus as claimed in claim 5, in which said target area for the first deposition source is mounted on a support such that the angle through which the particle stream may be directed can be adjusted.

* * * * *